US010751980B2

(12) United States Patent
Sawamoto et al.

(10) Patent No.: US 10,751,980 B2
(45) Date of Patent: Aug. 25, 2020

(54) MULTILAYER FILM

(71) Applicant: Toray Industries, Inc., Tokyo (JP)

(72) Inventors: Atsushi Sawamoto, Otsu (JP); Masanori Sueoka, Otsu (JP); Kazuma Matsui, Otsu (JP); Kohei Sato, Otsu (JP); Akimitsu Tsukuda, Otsu (JP); Junji Michizoe, Gumi (KR); Do Kyun Kim, Gumi (KR)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 16/312,780

(22) PCT Filed: Jun. 14, 2017

(86) PCT No.: PCT/JP2017/021943
§ 371 (c)(1),
(2) Date: Dec. 21, 2018

(87) PCT Pub. No.: WO2017/221783
PCT Pub. Date: Dec. 28, 2017

(65) Prior Publication Data
US 2019/0217587 A1    Jul. 18, 2019

(30) Foreign Application Priority Data

Jun. 24, 2016  (JP) .................................. 2016-125523

(51) Int. Cl.
| | | |
|---|---|---|
| *B32B 27/34* | (2006.01) | |
| *B32B 27/00* | (2006.01) | |
| *C08J 7/046* | (2020.01) | |
| *C09D 7/20* | (2018.01) | |
| *B32B 7/02* | (2019.01) | |
| *C08J 7/04* | (2020.01) | |
| *B32B 27/28* | (2006.01) | |
| *B32B 38/00* | (2006.01) | |

(52) U.S. Cl.
CPC ............... *B32B 27/34* (2013.01); *B32B 7/02* (2013.01); *B32B 27/00* (2013.01); *B32B 27/281* (2013.01); *C08J 7/042* (2013.01); *C08J 7/046* (2020.01); *C09D 7/20* (2018.01); B32B 2038/0052 (2013.01); B32B 2307/536 (2013.01); B32B 2457/208 (2013.01); C08J 2379/08 (2013.01)

(58) Field of Classification Search
CPC ...... B32B 2038/0052; B32B 2307/536; B32B 2457/208; B32B 27/00; B32B 27/281; B32B 27/34; B32B 7/02; C08J 2379/08; C08J 2433/06; C08J 7/042; C08J 7/046; C09D 7/20
See application file for complete search history.

(56) References Cited

U.S. PATENT DOCUMENTS

| | | |
|---|---|---|
| 2006/0106193 A1 | 5/2006 | Moriyama et al. |
| 2017/0106636 A1* | 4/2017 | Jo .......................... B32B 27/281 |
| 2019/0185633 A1* | 6/2019 | Mulzer ....................... C08J 7/16 |

FOREIGN PATENT DOCUMENTS

| | | |
|---|---|---|
| EP | 2800104 A1 | 11/2014 |
| EP | 3018164 A1 | 5/2016 |
| JP | 8-15682 A | 1/1996 |
| JP | 2002-700286 A | 5/2002 |
| JP | 2005-15790 A | 1/2005 |
| JP | 2005-219223 A | 8/2005 |
| JP | 2006-178123 A | 7/2006 |
| JP | 2007-147798 A | 6/2007 |
| JP | 2009-198811 A | 9/2009 |
| JP | 2014-5446 A | 1/2014 |
| JP | 2014-25061 A | 2/2014 |
| JP | 2014-65172 A | 4/2014 |
| JP | 2014-134674 A | 7/2014 |
| JP | 2014-139296 A | 7/2014 |
| JP | 2014-210412 A | 11/2014 |
| JP | 2015-120886 A | 7/2015 |
| JP | 2015-222412 A | 12/2015 |
| JP | 2016-78455 A | 5/2016 |
| WO | 2004/039863 A1 | 5/2004 |

OTHER PUBLICATIONS

The Extended European Search Report dated Jan. 27, 2020, of counterpart European Application No. 17815252.6.

* cited by examiner

*Primary Examiner* — John D Freeman
(74) *Attorney, Agent, or Firm* — DLA Piper LLP (US)

(57) ABSTRACT

A laminated film includes, at least on one side thereof, a layer containing a hardening resin, having a total thickness of 1 to 100 μm, a light transmittance of 70% or more at a wavelength of 400 nm, a Young's modulus of 5 GPa or more when applying a nanoindenter to make a 1 μm depression in the thickness direction into the surface of the hardening layer, and undergoing a rate of deformation of 500 ppm or less after applying a stress of 0.5 MPa for 30 minutes.

7 Claims, No Drawings

MULTILAYER FILM

TECHNICAL FIELD

This disclosure relates to a laminated film suitably usable as a display film, particularly as a surface cover film for a flexible display.

BACKGROUND

In recent years, efforts toward the development of flexible displays have been made in full swing. These displays require films that substitute for glass to reduce their weight and prevent cracking due to bending or impact. In particular, as a material to substitute for glass used for the front faces of touch panels, there are increasing demands for films having surfaces that are resistant to scratching, specifically, with a pencil hardness of 5H or higher. It is necessary for such a film to have not only a high transparency, but also a high bending resistance, which is in a trade-off relationship with the above-mentioned surface hardness.

As techniques for improving the surface hardness, Japanese Unexamined Patent Publication (Kokai) No. 2014-65172, Japanese Unexamined Patent Publication (Kokai) No. 2014-134674, Japanese Unexamined Patent Publication (Kokai) No. 2014-210412 and Japanese Unexamined Patent Publication (Kokai) No. HEI 8-15682 have proposed high hardness films having hard coat layers on film layers of acrylic resin, polyester resin, triacetyl cellulose resin or the like. However, they have the problem of deterioration in bending resistance because an increase in the total film thickness is necessary to realize a high surface hardness. Japanese Unexamined Patent Publication (Kokai) No. 2009-198811, Japanese Unexamined Patent Publication (Kokai) No. 2007-147798 and Japanese Unexamined Patent Publication (Kokai) No. 2006-178123 have proposed thin films having high hardness. However, a sufficiently high bending resistance cannot be maintained as the bending curvature decreases. In addition, Japanese Unexamined Patent Publication (Kokai) No. 2005-15790 describes a fully aromatic polyamide film. That film has high bending resistance, but it cannot realize a sufficiently high surface hardness when used in the form of a single film layer.

It could therefore be helpful to provide a laminated film that has a high surface hardness even when being thin to ensure the simultaneous realization of a high surface hardness and a high bending resistance.

SUMMARY

We thus provide:
a laminated film including, at least on one side thereof, a hardening layer containing a hardening resin,
having a total thickness of 1 to 100 μm,
having a light transmittance of 70% or more at a wavelength of 400 nm,
showing a Young's modulus of 5 GPa or more when applying a nanoindenter to make a 1 μm depression in the thickness direction into the surface of the hardening layer, and
undergoing a rate of deformation of 500 ppm or less after applying a stress of 0.5 MPa for 30 minutes.

We provide a laminated film that has a high surface hardness even when being thin to ensure the simultaneous realization of a high surface hardness and a high bending resistance. In particular, it is suitably usable as a surface cover film for a display.

DETAILED DESCRIPTION

The laminated film is in the form of a laminated film that includes a base film having hardening resin at least on one side thereof (hereinafter occasionally referred to as hardening layer), wherein the total thickness of the laminated film is 1 to 100 μm. When the total thickness of the laminated film is smaller than 1 μm, the handleability may be low. If the total thickness is more than 100 μm, on the other hand, it may lead to a flexible display having a deteriorated bending resistance making the display unable to work appropriately. To ensure simultaneous realization of a higher level surface hardness and bending resistance, the total thickness of the laminated film is more preferably 5 to 80 μm, still more preferably 10 to 50 μm.

The hardening resin contained in the hardening layer is preferably a thermosetting resin or an ultraviolet hardening resin, and specific examples thereof include organic silicone based, polyol based, melamine based, epoxy based, polyfunctional acrylate based, urethane based, and isocyanate based resins, as well as organic-inorganic hybrid type ones, which are composite materials containing both organic materials and inorganic materials, and silsesquioxane based ones having hardenable functional groups. More preferable ones include epoxy based, polyfunctional acrylate based, organic-inorganic hybrid type, and silsesquioxane based resins. Still more preferable ones include polyfunctional acrylate based, organic-inorganic hybrid based, and silsesquioxane based resins.

Preferable examples of polyfunctional acrylate based and silsesquioxane based resins usable as hardening resins include polyfunctional acrylate monomers and oligomers, urethane acrylate oligomers, alkoxysilane, alkoxysilane hydrolysate, and alkoxysilane oligomers. A polyfunctional acrylate monomer as described above may be a polyfunctional acrylate, and a modified polymer thereof that contains two or more (meth)acryloyloxy groups in a molecule, and specific examples thereof include pentaerythritol tri(meth)acrylate, pentaerythritol tetra(meth)acrylate, dipentaerythritol tri(meth)acrylate, dipentaerythritol tetra(meth)acrylate, dipentaerythritol penta(meth)acrylate, dipentaerythritol hexa(meth) acrylate, trimethylolpropane tri(meth)acrylate, and pentaerythritol triacrylate hexamethylene diisocyanate urethane polymer. These monomers may be used singly or as a combination of two or more thereof.

In addition, it is preferable that each hardening layer contains one or more types of particles. The aforementioned particles may be either inorganic particles or organic particles, but incorporation of inorganic particles is preferable to ensure improved surface hardness. There are no specific limitations on the material of the inorganic particles, but useful ones include oxides, silicides, nitrides, borides, chlorides, and carbonates of metals and metalloids. More specifically, it is preferable to use particles of at least one type selected from the group consisting of silica ($SiO_2$), aluminum oxide ($Al_2O_3$), zinc oxide (ZnO), zirconium oxide ($ZrO_2$), titanium oxide ($TiO_2$), antimony oxide ($Sb_2O_3$), and indium tin oxide ($In_2O_3$). When introducing particles with the aim of improving the surface hardness, it is preferable for the particle diameter thereof to be 1 to 300 nm. To ensure simultaneous realization of a higher level surface hardness and bending resistance, it is preferable for the particle diameter thereof to be 50 to 200 nm, more preferably 100 to 150 nm. It is preferable to use surface-treated particles. The term "surface treatment" means introduction of a compound over the particle surface by chemical bonds (such as covalent bond, hydrogen bond, ionic bond, van der Waals bond, hydrophobic bond, or the like) or adsorption (such as physical adsorption and chemical adsorption).

Furthermore, the contents of particles and resin in each hardening layer preferably have a mass ratio (particles/resin) of 20/80 to 80/20. The surface hardness will not be sufficiently high if the particles/resin ratio is less than 20/80 whereas the bending resistance may decrease if it is more than 80/20. To ensure simultaneous realization of a higher level surface hardness and bending resistance, the particles/resin mass ratio is preferably 30/70 to 70/30, more preferably 40/60 to 60/40.

It is preferable that each hardening layer located on either side of the film has a thickness of 1 to 20 µm. It is more preferably 1 to 10 µm. The surface hardness is likely to be low if the thickness of the hardening layer is less than 1 µm. If the thickness of the hardening layer is more than 10 µm, on the other hand, the hardening layer contained in a laminated film may suffer formation of cracks when the laminated film is bent. One hardening layer located on one side of the film may contain either one layer or a plurality of layers. When it has two types of layers, namely, a layer containing hardening resin B (layer B) and a layer containing hardening resin C (layer C) and when it is assumed that layer B is the layer in contact with the film (layer A) and that layer C is the layer in contact with layer B, it is preferable that the laminate contains any lamination structure selected from the following: layer B/layer A, layer C/layer B/layer A, layer B/layer A/layer B, and layer C/layer B/layer A/layer B/layer C. It is more preferable that it contains any lamination structure selected from the following: layer C/layer B/layer A, layer B/layer A/layer B, and layer C/layer B/layer A/layer B/layer C.

To produce a hardening layer having a thickness in the above range, a useful technique is to dilute or dissolve a hardening resin, particles or the like in an organic solvent and spread the resulting solution over the film with a wire bar, slit die and the like. Subsequently, the hardening resin spread over the film hardens to produce a hardening layer having an intended thickness. Useful hardening methods include heat hardening and photohardening using ultraviolet ray or electron beam (EB), although there are no specific limitations thereon. The organic solvent used to dilute or dissolve the hardening resin is preferably at least one or more selected from the following: methanol, ethanol, isopropyl alcohol, acetone, methyl ethyl ketone, methyl isobutyl ketone, ethyl acetate, methyl acetate, butyl acetate, toluene, methylene chloride, and butyrocellulose. When using a commercially available hardening resin, furthermore, it may be in the form of a solution already diluted with a solvent other than the aforementioned organic solvents, and when using such a hardening resin, the solvent may be in the form of a mixed solvent with the aforementioned one. In that example, the aforementioned solvent preferably accounts for 30 mass % or more. If the concentration of the solvent is less than 30 mass %, the film may suffer reduced transparency, curling, or creasing during the coating step.

Between the base film and the hardening layer, the laminated film preferably has an interlayer with a thickness of 0.5 to 6.0 µm that differs in electronic density as measured by SEM from both the film and the hardening layer. The difference in electronic density is determined by measuring the grayscale distribution in the SEM photograph using an image analyzer and binarized. The interlayer works to develop adhesive strength between the base film and the hardening layer to make them more resistant to peeling when subjected to repeated bending. Peeling may occur due to repeated bending if the thickness of the interlayer is less than 0.5 µm whereas the hardness can decrease if the thickness is more than 6.0 µm. An interlayer thickness of 0.5 to 6.0 µm can be achieved if a solvent consisting of a good solvent and a poor solvent with a mass ratio of 15/85 to 50/50 is adopted as the solvent used for forming the hardening layer as described later. Preferred examples of the good solvent include acetone, methyl ethyl ketone, methyl isobutyl ketone, n-methyl-2-pyrrolidone, and butyrocellulose, whereas preferred examples of the poor solvent include ethanol, methanol, isopropyl alcohol, butyl acetate, ethyl acetate, methyl acetate, toluene, and methylene chloride.

For the laminated film, furthermore, the elastic modulus values of the base film, hardening layer, and interlayer, which are herein referred to as EA, EB, and EC, respectively, preferably meet the relations of EA>EC and EB>EC. The elastic modulus of each layer can be determined on the basis of the cross section of the laminated film determined by force-volume measurement performed by atomic force microscopy (AFM). If the relations of EA>EC and EB>EC are met simultaneously, the interlayer serves as a buffer layer when the laminated film is bent to reduce the difference in stress that occurs between the base film and the hardening layer. This prevents the laminated film from suffering from the formation of streaks, deterioration in planarity, or formation of cracks in the hardening layer when subjected to repeated bending. The relations of EA>EC and EB>EC can be achieved simultaneously if a solvent consisting of a good solvent and a poor solvent with a mass ratio of 15/85 to 50/50 is adopted as the solvent used to form the hardening layer as described later. Preferred examples of the good solvent include acetone, methyl ethyl ketone, n-methyl-2-pyrrolidone, and butyrocellulose, whereas preferred examples of the poor solvent include ethanol, methanol, isopropyl alcohol, butyl acetate, ethyl acetate, methyl acetate, toluene, and methylene chloride.

For the laminated film, the surface of the hardening layer preferably has an average roughness Ra of 1 to 10 nm. The surface may suffer from poor slip properties and low resistance to flaws when Ra is less than 1 nm whereas it will easily suffer from flaws as a result of the removal of surface protrusions when Ra is more than 10 nm. To ensure increased resistance to flaws, it is more preferable for the average roughness Ra to be 2 to 8 nm, still more preferably 3 to 7 nm. Formation of a hardening layer having a surface with an average roughness Ra of 1 to 10 nm can be achieved if particles having a particle diameter as described above are added in an amount as described above.

The laminated film shows a Young's modulus of 5 GPa or more when applying a nanoindenter to make a 1 µm depression in the thickness direction into the surface of the hardening layer. If its Young's modulus is less than 5 GPa, it may lead to a display that can easily undergo dents when coming into contact with other objects. There are no specific limitations on the upper limit of the Young's modulus, but it is commonly about 20 GPa. For more effective prevention of defects such as dents that may result from contact with other objects, it is more preferable that the film shows a Young's modulus of 6 GPa or more, more preferably 7 GPa or more, when applying a nanoindenter to make a 1 µm depression in the thickness direction. Such a Young's modulus can be achieved by adopting a particle diameter and a resin type as described above in forming the hardening layer.

When the film has hardening layers on both surfaces thereof, the requirement for Young's modulus is preferably met for at least either of them, and the requirement for Young's modulus is more preferably met for both of the hardening layers.

The laminated film has a light transmittance of 70% or more at a wavelength of 400 nm. If the light transmittance of the film at a wavelength of 400 nm is less than 70%, a cover film produced therefrom can have a decreased visibility. The upper limit of the light transmittance is 100%. It is more preferably 75% or more, more preferably 80% or more, because in that example, a display that ensures clear image visibility can be produced. The requirement for a light transmittance of 70% or more at a wavelength of 400 nm can be met by using a polymer that is low in absorbance in the lower part of the visible light wavelength range, for example, a polymer containing a structural unit as represented by any of chemical formulae (I) to (IV) described below.

It is preferable for the laminated film to have a yellowness index (YI) of 5.0 or less. If the yellowness index (YI) is more than 5.0, a cover film produced therefrom can have a decreased visibility. To ensure an improved visibility, the value is preferably 4.0 or less, more preferably 3.5 or less. A yellowness index (YI) of 5.0 or less will be ensured if the polymer adopted to form the film has a structure in which conjugated bonding does not extend over a long distance. In an aromatic substance, in particular, it is preferable for its aromatic ring to contain an electron-withdrawing substituent group such as fluorine.

It is preferable for the laminated film to have a glass transition temperature of 150° C. or more. The glass transition temperature is more preferably 200° C. or more, and the glass transition temperature is still more preferably 250° C. or more. If the glass transition temperature is less than 150° C., curling, cracking, or position shifting may occur when ITO formed on the film is cured or when a thin film transistor (TFT) is prepared. A glass transition temperature of 150° C. or more can be achieved if, for example, aromatic polyimide or polyimide is used as material for the film.

It is preferable for the laminated film to have a haze of 5% or less. If the haze is more than 5%, a displaying apparatus that contains the film may suffer from a decrease in brightness. To increase the brightness, it is more preferably 4% or less, still more preferably 3% or less. A haze of 5% or less can be achieved by reducing the quantity of foreign objects in the film to decrease the internal haze and making the film surface smooth to reduce the diffused reflection (external haze) of the surface.

The laminated film preferably has a Young's modulus of more than 5.0 GPa at least in one surface direction in the laminated film. If the Young's modulus is more than 5.0 GPa, it will contribute not only to the improvement in surface hardness, but also to the improvement in handleability. For the same reason, it is preferable also for the storage modulus at 30° C. to be 5.0 GPa or more. It is more preferable that the storage modulus at 30° C. is 5.5 GPa or more, still more preferable that the storage modulus at 30° C. is 6.0 GPa or more, and most preferable that the storage modulus at 30° C. is 7.0 GPa or more. To ensure a Young's modulus of more than 5.0 GPa at least in one surface direction in the laminated film, it is preferable, for example, that the film to be used as the base is drawn during the film production process so that molecular chains are stretched to provide a laminated film with an increased Young's modulus. The draw ratio is preferably 1.05 to 10.00 and more preferably 1.05 to 8.00 at least in one direction. The ratio is still more preferably 1.05 to 5.00. The drawing can have little effect if it is less than 1.05, whereas the film may rupture if it is more than 10.00. It is also preferable to draw the film in two mutually perpendicular directions.

The laminated film undergoes a rate of deformation of 500 ppm or less after receiving a stress of 0.5 MPa for 30 minutes at least in one direction. If it is more than 500 ppm, the film may suffer from the formation of streaks, deterioration in planarity, or formation of cracks in the hardening layer when subjected to repeated bending. To ensure an increased bending resistance, it is preferably 0 to 500 ppm, more preferably 0 to 300 ppm, and still more preferably 0 to 100 ppm. To ensure a rate of deformation of 500 ppm or less after receiving a stress of 0.5 MPa for 30 minutes, it is important to select appropriate types of resin and particles to form the film and hardening layer and perform the control of molecular orientations in the film appropriately. As a method for the control of molecular orientations in the film, it is preferable to draw the base film to a ratio of 1.05 to 10.00, more preferably 1.05 to 5.00, at least in one direction. The ratio is still more preferably 1.05 to 3.00. The drawing can have little effect if it is less than 1.05, whereas the film may rupture if it is more than 10.00. It is also preferable to draw the film in two mutually perpendicular directions. In addition, it is preferable for the heat treatment temperature to be 250° C. to 340° C., more preferably 300° C. to 340° C. The polymer material of the base film is preferably a polymer selected from the group consisting of polyamide, aromatic polyamide, and polyimide as described later. It is preferable for the hardening layer to contain the aforementioned particles and resin.

A typical production method for the laminated film is described below.

As a technique to produce a hardening layer, it is preferable to spread, dry, and harden, in this order, a paint of a hardening resin over a film base. To than two or more hardening layers on one side, it is preferable to perform sequential or simultaneous coating to form such layers on a base film.

In a sequential coating step as referred to herein, one coating material is spread by dip coating, roller coating, wire bar coating, gravure coating, die coating, or the like, followed by drying and hardening to form a first hardening layer, and then another coating material that is different from the first is spread over the first hardening layer, followed by drying and hardening to form a second hardening layer. Appropriate types and number of hardening layers may be adopted as required. In a simultaneous coating step, on the other hand, two or more types of coating materials are spread simultaneously using a multilayer slit die, followed by drying and hardening to produce a hardening layer having two or more layers in one coating step.

There are no specific limitations on the drying method to use, and good methods include heat transfer drying, hot air drying, infrared ray drying, and microwave drying, of which hot air drying is preferred.

Good methods of hardening include heat hardening by exposure to heat and active energy ray hardening by exposure to electron beam, ultraviolet ray or the like. In heat-hardening, material hardens preferably at a temperature of 23° C. to 200° C., more preferably at 80° C. to 200° C. In hardening by exposure to ultraviolet ray or electron beam, it is preferable to minimize the oxygen concentration, and it is more preferable to perform hardening in an inert gas atmosphere. Hardening may not be achieved sufficiently if the oxygen concentration is high. The useful types of ultraviolet ray lamps that can be used to apply ultraviolet ray include, for instance, discharge lamp, flash lamp, laser, and electrodeless lamp. When a high pressure mercury lamp, which is a discharge lamp, is used to perform ultraviolet ray hardening, it is preferable to adopt ultraviolet ray with an illuminance of 100 to 3,000 mW/cm², more preferably 200 to 2,000 mW/cm². The illuminance is still more preferably 200 to 1,500 mW/cm².

When producing a laminated film, it is preferable to apply a protective film. The protective film referred to above is a film having a weak adhesive layer at least on one side thereof. Application of a protective film depresses the curling that may occur when a hardening layer is disposed only on one side and decreases the coating unevenness that may occur during the coating of the opposite side.

To ensure both a high light transmittance and good mechanical characteristics including Young's modulus in the thickness direction, the laminated film is preferably a laminated film composed mainly of a film (base film) incorporating a resin having a fluorine-containing polymer structure and a hardening layer disposed at least on one side thereof, and the resin is at least one resin selected from a group consisting of polyamide, aromatic polyamide, polyimide, aromatic polyimide, polyamide-imide, and aromatic polyamide-imide. It is more preferable to use a polyamide or an aromatic polyamide having a fluorine-containing polymer structure, and it is still more preferable to use an aromatic polyamide having a fluorine-containing polymer structure. If fluorine is not contained in the polymer structure, light transmittance in the visible light range may decrease, possibly leading to difficulty in functioning appropriately when applied to the front face (as cover film) of a touch panel. When the resin used is one other than polyamide, aromatic polyamide, polyimide, aromatic polyimide, polyamide-imide, or aromatic polyamide-imide, the hardening layer may not have a sufficiently high bearing capacity, possibly leading to a decreased Young's modulus in the thickness direction, a decreased intermolecular interaction, an increased creep and the like.

Whether or not fluorine is contained in the polymer structure of the base film can be determined by preparing a cross-sectional specimen of the laminated film by resin-embedded processing or freezing and subjecting it to chemical composition analysis by infrared (IR) spectroscopy.

If the laminated film is immersed in an aprotic polar solvent such as N-methyl-2-pyrrolidone (NMP) and dimethyl sulfoxide (DMSO), only the base film will be dissolved and, therefore, another good method is to perform composition analysis of the resulting solution by infrared (IR) spectroscopy, nuclear magnetic resonance (NMR) spectroscopy and the like, to determine whether fluorine is contained in the polymer structure of the base film.

It is preferable for the laminated film to be a laminated film including a base film having a structural unit as represented by any of chemical formulae (I) to (IV) with a hardening layer disposed at least on one side thereof.

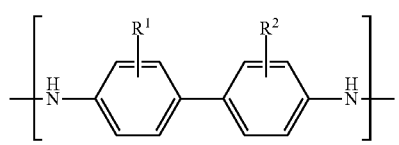

(I)

$R^1$ and $R^2$ are each —H, an aliphatic group containing 1 to 5 carbon atoms, —CF₃, —CCl₃, —OH, —F, —Cl, —Br, —OCH₃, a silyl group, or a group containing an aromatic ring. They are preferably —CF₃, —F, —Cl, or a group containing an aromatic ring.

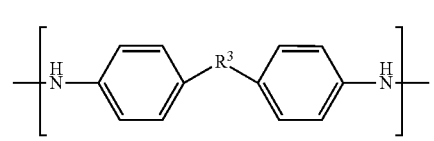

(II)

$R^3$ is a group containing Si, a group containing P, a group containing S, a halogenated hydrocarbon group, a group containing an aromatic ring, or a group containing an ether bond (structural units having these groups may coexist in a molecule). It is preferably a group containing Si, a halogenated hydrocarbon group, a group containing an aromatic ring, or a group containing an ether bond. It is more preferably a group containing Si.

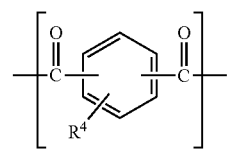

(III)

$R^4$ may be any appropriate group. There are no specific limitations on it, but it is preferably —H, —Cl, or —F.

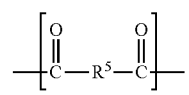

(IV)

$R^5$ may be any appropriate aromatic group or any appropriate alicyclic group. There are no specific limitations on it, but it is more preferably a phenyl, biphenyl, cyclohexane, or decalin.

The description given below is based on examples in which a polyamide film, an aromatic polyamide film or the like are used as the base film, but needless to say, this disclosure is not limited thereto.

To prepare a polyamide solution to serve as film-forming solution, there are various useful methods including, for example, low-temperature solution polymerization, interfacial polymerization, melt polymerization, and solid phase polymerization. In low-temperature solution polymerization in which polymerization is performed from carboxylic acid dichloride and diamine, the synthesis is carried out in an aprotic organic polar solvent.

Useful carboxylic acid dichlorides include terephthalic acid dichloride, 2-chloro-terephthalic acid dichloride, 2-fluoro-terephthalic acid dichloride, isophthalic acid dichloride, naphthalene dicarbonyl chloride, 4,4'-biphenyl dicarbonyl chloride, terphenyl dicarbonyl chloride, 1,4-cyclohexanedicarboxylic acid chloride, 1,3-cyclohexanedicarboxylic acid chloride, and 2,6-decalindicarboxylic acid chloride, of which 1,4-cyclohexanedicarboxylic acid chloride, terephthalic acid dichloride, 4,4'-biphenyl dicarbonyl chloride, isophthalic acid dichloride, and 2-chloro-terephthalic acid dichloride are preferable.

Useful diamines include, for example, 4,4'-diaminodiphenyl ether, 3,4'-diaminodiphenyl ether, 4,4'-diaminodiphenyl sulfone, 3,3'-diaminodiphenyl sulfone, 2,2'-ditrifluoromethyl-4,4'-diaminobiphenyl, 9,9-bis(4-aminophenyl) fluorene, 9,9-bis(4-amino-3-methylphenyl) fluorene, bis[4-(4- aminophenoxy)phenyl]sulfone, bis[3-(3-aminophenoxy) phenyl]sulfone, bis[4-(3-aminophenoxy)phenyl]sulfone, 2,2-bis[4-(4-aminophenoxy)phenyl]propane, 2,2-bis(4-aminophenyl) hexafluoropropane, o-tolidine, 2,2'-dimethyl-4,4'-diaminobiphenyl (m-tolidine), 1,1-bis(4-aminophenyl) cyclohexane, and 3,3',5,5'-tetramethyl benzidine, of which 2,2'-ditrifluoromethyl-4,4'-diaminobiphenyl and 4,4'-diaminodiphenyl sulfone are preferable. Hydrogen chloride is generated as a by-product when an acid dichloride and diamine are used as monomers to produce a polyamide solution, and it is neutralized by using an inorganic neutralization agent such as calcium hydroxide, calcium carbonate, and lithium carbonate, or an organic neutralization agent such as ethylene oxide, propylene oxide, ammonia, triethylamine, triethanolamine, and diethanolamine. Reaction between isocyanate and carboxylic acid is performed in an aprotic organic polar solvent in the presence of a catalyst.

When diamine and dicarboxylic acid dichloride are used as starting materials, the product will have either amine terminals or carboxylic acid terminals depending on the component ratio between the starting materials. Other amines, carboxylic acid chlorides, or carboxylic anhydrides may be used for end capping. Useful compounds for end capping include, for example, benzoyl chloride, substituted benzoyl chloride, acetic acid anhydride, 5-norbornene-2,3-dicarboxylic acid anhydride, 4-ethynyl aniline, 4-phenyl-ethynylphthalic acid anhydride, and maleic acid anhydride.

For the production of polyamide, desirable aprotic polar solvents to use include, for example, sulfoxide based solvents such as dimethyl sulfoxide and diethyl sulfoxide, formamide based solvents such as N,N-dimethyl formamide and N,N-diethyl formamide, acetamide based solvents such as N,N-dimethyl acetamide and N,N-diethyl acetamide, pyrrolidone based solvents such as N-methyl-2-pyrrolidone and N-vinyl-2-pyrrolidone, phenolic solvents such as phenol, o-, m-, or p-cresol, xylenol, halogenated phenol, and catechol, and others such as hexamethyl phosphoramide and γ-butyrolactone, which may be used single or as a mixture. In addition, aromatic hydrocarbon such as xylene and toluene can also be used. The solvent may also contain 50 mass % or less of salts of alkali metals or alkaline earth metals with the aim of promoting the dissolution of the polymer.

In a base film formed of polyamide, aromatic polyamide, or polyimide having a fluorine-containing polymer structure, it may contain inorganic or organic additives intended for surface formation, processability improvement or the like. Additives intended for surface formation include, for example, inorganic particles of $SiO_2$, $TiO_2$, $Al_2O_3$, $CaSO_4$, $BaSO_4$, $CaCO_3$, carbon black, carbon nanotube, fullerene, and zeolite, as well as fine powder of other metals. Preferable organic particles include, for example, particles of organic polymers such as crosslinked polyvinylbenzene particles, crosslinked acrylate particles, crosslinked polystyrene particles, polyester particles, polyimide particles, polyamide particles, and fluorine resin particles as well as inorganic particles having surfaces treated with these organic polymers.

A film-forming solution prepared as described above is then processed by a so-called solution film-forming method to provide a film. The so-called solution film-forming methods include dry and wet methods, dry methods, and wet methods, and any of these methods may be adopted to produce a film, of which a dry and wet method is described below by way of example.

To produce a film by a dry and wet method, the above film-forming solution is discharged through a nozzle onto a support such as drum, endless belt, and support film to form a thin film, followed by drying until the thin film layer gains self-retainability. The drying step can be performed appropriately, for example, under the conditions of 23° C. to 220° C. and 60 minutes. A film with a smoother surface can be obtained with an increasing smoothness of the surface of the drum, endless belt, or support film used in this drying step. The film (sheet) obtained from the drying step is removed from the support and introduced into a wet step where demineralization, desolvation and the like are performed, followed by additional steps for stretching, drying, and heat treatment to provide a film. To control mechanical characteristics such as creep as described above, it is preferable for the heat treatment temperature to be 250° C. to 340° C., more preferably 280° C. to 340° C., and still more preferably 300° C. to 320° C. The yellowness index (YI) may increase if it is more than 340° C. The heat treatment time is preferably 30 seconds or more, more preferably 1 minute or more, still more preferably 3 minutes or more, and still more preferably 5 minutes or more. Furthermore, it is preferable for the heat treatment to be performed in an inactive atmosphere such as nitrogen and argon.

The base film formed of polyamide, aromatic polyamide, or polyimide having a polymer structure containing fluorine may be in the form of a laminated film. To produce such a laminated film, layers are stacked before or inside the nozzle and then cast onto a support. To stack layers before the nozzle, useful lamination methods include the use of a pinole, multiple unit tube, feedblock and the like. To stack layers inside the nozzle, useful methods include the use of a multiple layer nozzle or a multimanifold nozzle. In many examples, the organic solvent solution used for the resin and the organic solvent solution used for the polymer such as aromatic polyamide (resin composition) differ in solution viscosity. Accordingly, it may possibly become difficult to obtain a good lamination structure if, for example, the method using a pinole, in which lamination is performed before the nozzle, is adopted. It is preferable, therefore, to use a multimanifold nozzle to perform lamination.

In the film production method, it is preferable for the stretching to be performed at a draw ratio of 1.05 to 10.00 in both the film's length direction (film conveyance direction in the production process, hereinafter occasionally referred to as MD) and the width direction (film's in-plane direction perpendicular to the length direction, hereinafter occasionally referred to as TD) to control mechanical characteristics such as creep appropriately. The draw ratio in the MD direction is preferably 1.05 to 5.00, more preferably 1.05 to 3.00, still more preferably 1.05 to 2.00, and most preferably 1.05 to 1.50. The draw ratio in the TD direction is preferably 1.05 to 5.00, more preferably 1.05 to 3.00, still more preferably 1.05 to 2.00, and most preferably 1.05 to 1.50. In addition, the draw ratio in the TD direction is preferably 1.00 to 1.50 times as large as the draw ratio in the MD direction. It is more preferably 1.05 to 1.20 times, and most preferably 1.10 to 1.15 times.

The structure of a film depends on the type of starting material. To analyze the structure of a film produced from unknown materials, useful methods include mass analysis, magnetic nuclear resonance analysis, and spectroscopic analysis.

The laminated film described above can be used suitably for various applications including displaying materials, displaying material's substrates, circuit boards, flexible printed circuits (FPC), photoelectric circuit boards, optical waveguide substrates, semiconductor mounting substrates, multilayered laminated circuit boards, transparent electrically conductive films, retardation films, touch panels, cover films for displays (particularly for touch panels), capacitors, printer ribbons, sound diaphragms, solar batteries, optical recording mediums, base films for magnetic recording mediums, packaging materials, pressure sensitive adhesive tapes, adhesive tapes, and decorating materials.

EXAMPLES

Our films are now described in more detail with reference to examples.

The methods used herein to measure physical properties and the methods used to evaluate the effects are as described below.

(1) Thickness of Layers of Laminated Film

For a layered body containing aromatic polyamide, the thickness of each layer is determined by observing the cross section of the layered body using the apparatus described below and calculating the thickness of each layer on the basis of the scale of the observed image.

Observation apparatus: field emission scanning electron microscope (FE-SEM) (JSM-6700F) manufactured by JEOL Ltd.

Observation magnification: ×3,000

Observation mode: LEI mode

Accelerating voltage: 3 kV

The cross-sectional specimen of each layered body for observation was prepared using the apparatuses described below.

Apparatus: rotary microtome (MODEL: RM) and electronic sample freezer (MODEL: RM) manufactured by Nihon Microtome Laboratory, Inc.

(2) Pencil Hardness

Measurements were taken at a temperature of 23° C. and a humidity of 65% RH using HEIDON-14DR manufactured by Shinto Scientific Co. Ltd. Measuring conditions used are as described below. The pencil hardness was represented according to the criteria described below and rated as 10B for the softest and 9H for the hardest. Accordingly, the term "a pencil hardness of H or higher", for example, means a pencil hardness of any of H, 2H, 3H, . . . , and 9H.

Weight: 750 g

Angle: 45°

Scratching speed: 30 mm/min

Scratching: 5 scratches of 10 mm

State of specimen: pasting a film specimen on a glass plate using a tape

Pencil hardness: 10B (soft), B, HB, F, H, 2H, . . . , 9H (hard)

Rating for pencil hardness: If three of five specimens of a film tested for a specific hardness were free of scratches, that film was rated as having that hardness. For example, if two of five specimens subjected to scratching test with a pencil of H are found to have scratches and three of five specimens subjected to scratching test with a pencil of 2H are found to have scratches, then they are rated as having a pencil hardness of H. For another example, if two or less of five specimens subjected to scratching test with a pencil of 2H were found to have scratches, it is decided that their pencil hardness is at least 2H or higher.

(3) Bending Resistance

A sample was bent using a mandrel manufactured by Allgood Co., Ltd., which is suitable for JIS-K5600-5-1 (1999) "Film Bending Test", and rated on the basis of the curvature radius R.

Sample size: short side 50 mm×long side 100 mm

Sample setting: set so that the position of 50 mm in the long side direction coincides with the bending line (tube contact position)

Bending: 10 times

Rated as

Excellent: no flaws, streaks, or cracks found when R is 1 mm

Good: no flaws, streaks, or cracks found when R is 2 mm, although they are found when R is 1 mm Fair: no flaws, streaks, or cracks found when R is 3 mm, although they are found when R is 2 mm Inferior: flaws, streaks, or cracks found when R is 3 mm (4) Light Transmittance at Wavelength of 400 nm Light transmittance measurements were taken using the apparatus described below and the measured light transmittance at a wavelength of 400 nm was adopted for evaluation.

$$\text{Light transmittance}[\%] = (Tr1/Tr0) \times 100$$

Tr1 is the intensity of light after passing through a specimen, and Tr0 is the intensity of light after passing through air over the same distance as in the light transmission test (but not passing through the specimen).

Apparatus: UV measuring apparatus U-3410 (manufactured by Hitachi Instruments Inc.)

Wavelength range: 300 to 800 nm

Measuring speed: 120 nm/min

Measuring mode: penetration (5) Yellowness Index (YI)

Measurements were taken at a temperature of 23° C. and a humidity of 65% RH using a spectrocolorimeter (manufactured by Nippon Denshoku Industries Co., Ltd.). The specimen size was 4 cm×5 cm and measurements were taken in the penetration mode.

(6) Haze

The measuring apparatus described below was used for the measurement.

Apparatus: turbidimeter NDH5000 (manufactured by Nippon Denshoku Industries Co., Ltd.)

Light source: white LED5V3W (rating)

light receiving element: Si photodiode provided with V(λ) filter

Measuring light flux: diameter 14 mm (light inlet aperture diameter 25 mm)

Optical conditions: according to JIS-K7136 (2000)

(7) Glass Transition Temperature

The apparatus described below was used for the measurement.

Apparatus: viscoelasticity measuring apparatus EXSTAR6000 DMS (manufactured by Seiko Instruments Inc.)

Measuring frequency: 1 Hz

Heating rate: 5° C./min

Temperature range: 25° C. to 380° C.

Retention time: 2 minutes

Glass transition temperature (Tg): The temperature at the maximum peak of Tan δ was adopted as glass transition temperature.

(8) Storage Modulus at 30° C.

The apparatus described below was used for the measurement and the storage modulus (E') at 30° C. was determined.

Apparatus: viscoelasticity measuring apparatus EXSTAR6000 DMS (manufactured by Seiko Instruments Inc.)

Measuring frequency: 1 Hz

Heating rate: 5° C./min

Temperature range: 25° C. to 380° C.

Retention time: 2 minutes (9) Young's Modulus Under 1 μm Depression by Nanoindenter The measuring apparatus described below was used for the measurement and the Young's modulus of a specimen depressed 1 μm by a nanoindenter was determined.

Apparatus: high accuracy ultra-microhardness tester Triboindenter TI950 (manufactured by Hysitron)

Measure method: nanoindentation method

Indenter used: triangular pyramid indenter of diamond

Measuring atmosphere: in the air at room temperature

(10) Rate of Deformation

The length was measured under tension applied in three steps of <1>, <2>, and <3> in this order using the apparatus described below.

Apparatus: thermomechanical analysis apparatus TMA-60/60H (manufactured by Seiko Instruments Inc.)

Sample size: width 4 mm, length 20 mm

Temperature: 23° C.

Tensile tension and time:

<1>0.1 MPa for 30 minutes: initial length measured under low tension

<2>0.5 MPa for 30 minutes: deformation caused under high tension

<3>0.1 MPa for 30 minutes: constant length reached after removal of tension

Calculation method: The absolute value of the calculation made by the equation given below, where L1 and L2 are the length measured at the end of the step <1> and the length measured at the end of the step <3>, respectively, was adopted to represent the rate of deformation.

Rate of deformation (ppm)=$(L2-L1)/L1 \times 1{,}000{,}000$

(11) Interlayer

The cross section of the layered body was observed using the apparatus described below to determine the thickness of the region that exists between the hardening layer and the film and has an electronic density different from those of the hardening layer and the film.

Observing apparatus: scanning electron microscope FE-SEM (JSM-6700F) manufactured by JEOL Ltd.

Observing magnification: 3,000

Observing mode: LEI mode

Accelerating voltage: 3 kV

The cross-sectional specimen of the layered body for observation was prepared using the apparatus described below.

Apparatus: rotary microtome (MODEL: RM) and electronic sample freezer (MODEL: RM) manufactured by Nihon Microtome Laboratory, Inc.

(12) Elastic Modulus Based on Force-Volume Measurement by Atomic Force Microscopy (AFM)

Using the apparatus described below, the elastic modulus was determined based on force-volume measurement performed by atomic force microscopy (AFM). Measurements were taken in the air at 23° C. and 65% RH.

Observing apparatus: scanning probe microscope (NanoScopeV Dimension Icon) manufactured by Bruker AXS Probe: silicon cantilever Scanning mode: force-volume (contact mode)

Cross section preparation: processing by cross section polisher (CP)

Preparation of the coating materials used in hardening layers and the production of base films were carried out according to the procedures described below. The structural formulae of the materials used here are given below.

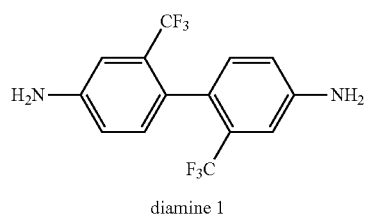

diamine 1

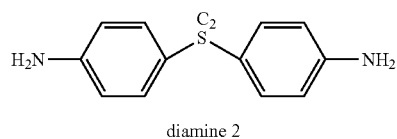

diamine 2

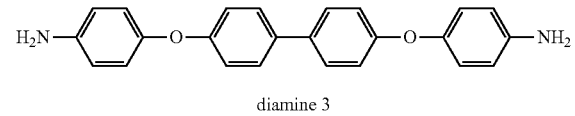

diamine 3

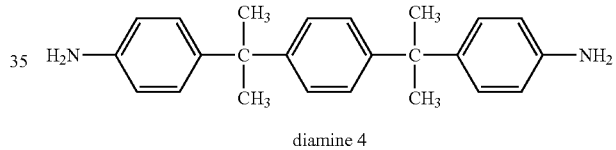

diamine 4

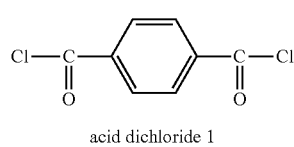

acid dichloride 1

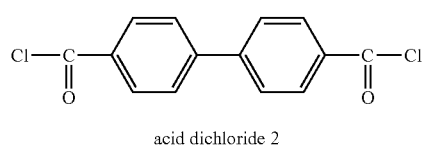

acid dichloride 2

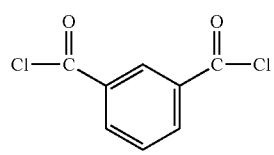

acid dichloride 3

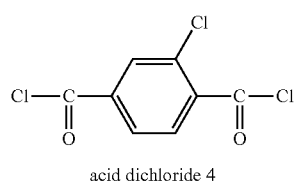

acid dichloride 4

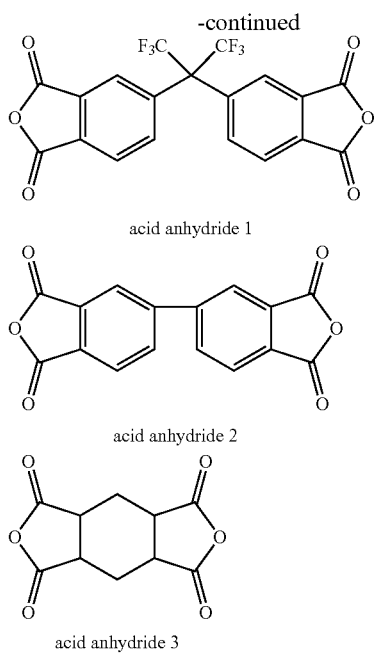

acid anhydride 1 acid anhydride 2 acid anhydride 3

(13) Preparation of Coating Materials Used in Hardening Layers (B1 to B3)

Using silica particles (Organosilica Sol, manufactured by Nissan Chemical Industries) as the particles and polyfunctional acrylate (KAYARAD PET30, manufactured by Nippon Kayaku Co., Ltd.) as the resin, hardening layer coating materials were prepared as specified in Table 1 for the diameter of the particles used, the surface treatment performed for the particles used, and the solvent used.

(14) Production of Base Film A1

In a 1,000 L reaction tank of glass lining equipped with a stirrer (having three sweptback wing type stirring blades), 19.90 kg of diamine 1, 3.85 kg of diamine 2, 7.00 kg of anhydrous lithium bromide, and 433.00 kg of N-methyl-2-pyrrolidone were fed and cooled to 0° C. in a nitrogen atmosphere, and a total of 4.33 kg of acid dichloride 2, divided into five parts, was added over 30 minutes while stirring. After stirring for 90 minutes, a total of 12.46 kg of acid dichloride 1, divided into 10 parts, was added. After stirring for 1 hour, the hydrogen chloride generated from the reaction was neutralized with lithium carbonate to provide a polymer solution with a polymer concentration of 7 mass %.

The resulting polymer solution was flow-cast through a nozzle onto an endless belt with a mirror surface to provide a final film having a thickness of 23 μm. Then, the flow-cast polymer solution was heated in hot air at 130° C. for 6 minutes to evaporate the solvent and the resulting film was removed from the endless belt while stretching it to a ratio of 1.11 in the length direction. Then, it was introduced into a water tank in which pure water at 40° C. was flowing to perform demineralization and desolvation. Furthermore, the film coming out of the water tank was introduced into a tenter, stretched to a ratio of 1.29 at 260° C., relaxed to a ratio of 0.98 at 340° C., and heat-treated at the same temperature to provide base film A1.

(15) Production of Base Film A2

Except for flow-casting a thicker layer onto the endless belt to produce a final film with a thickness of 40 μm, the same film production procedure as for base film A1 was carried out to provide base film A2.

(16) Production of Base Film A3

In a 1,000 L reaction tank of glass lining equipped with a stirrer (having three sweptback wing type stirring blades), 28.40 kg of diamine 1, 8.00 kg of anhydrous lithium bromide, and 424.00 kg of N-methyl-2-pyrrolidone were fed and cooled to 0° C. in a nitrogen atmosphere, and a total of 7.22 kg of acid dichloride 3, divided in 12 parts, was added over 30 minutes while stirring. After stirring for 90 minutes, a total of 10.74 kg of acid dichloride 1, divided into 12 parts, was added. After stirring for 1 hour, the hydrogen chloride generated from the reaction was neutralized with lithium carbonate to provide a polymer solution with a polymer concentration of 8 mass %.

The resulting polymer solution was flow-cast through a nozzle onto an endless belt with a mirror surface to provide a final film having a thickness of 12.5 μm. Then, the flow-cast polymer solution was heated in hot air at 130° C. for 6 minutes to evaporate the solvent and the resulting film was removed from the endless belt while stretching it to a ratio of 1.12 in the length direction. Then, it was introduced into a water tank in which pure water at 40° C. was flowing to perform demineralization and desolvation. Furthermore, the film coming out of the water tank was introduced into a tenter, stretched to a ratio of 1.25 at 260° C., relaxed to a ratio of 0.985 at 335° C., and heat-treated at the same temperature to provide base film A3.

(17) Production of Base Film A4

A 1.5 L reaction vessel equipped with a stirrer, a nitrogen injection apparatus, a dropping funnel, a temperature controller, and a cooler was used and 769 g of N,N-dimethyl acetamide (DMAc) was supplied through nitrogen to fill the reaction vessel. Then, after adjusting the reaction vessel to a temperature of 25° C., 64.046 g of diamine 1 was dissolved to provide a first solution, followed by maintaining this first solution at 25° C. After adding 8.885 g of acid anhydride 1 and 17.653 g of acid anhydride 2 to the first solution, stirring was continued for an appropriate period to cause dissolution and reaction to provide a second solution. During this period, the second solution was maintained at a temperature of 25° C. Then, 24.362 g of acid dichloride 1 was added to provide a polyamic acid solution having a solid content of 13 mass %.

After adding 13 g of pyridine and 17 g of acetic acid anhydride to the above polyamic acid solution, stirring was performed at 25° C. for 30 minutes and additional stirring was continued at 70° C. for 1 hour, followed by cooling to room temperature. The solution was poured into 20 L of methanol to cause precipitation and the precipitated solid material was separated by filtration, crushed, and dried at 100° C. for 6 hours under reduced pressure to provide 108 g of solid powder of a polyamide-imide copolymer. The above 108 g of solid powder of a polyamide-imide copolymer was dissolved in 722 g of N,N-dimethyl acetamide (DMAc) to provide a solution with a concentration of 13 wt %. The solution thus obtained was spread over a stainless steel plate and dried in hot air at 130° C. for 30 minutes and the resulting film was removed from the stainless steel plate and fixed to a frame with pins. The frame and the film fixed thereto were put in a vacuum oven, heated up gradually for 2 hours from 100° C. to 300° C., and then gradually cooled, followed by separating the polyamide-imide film from the frame. Subsequently, the polyamide-imide film was subjected to the final heat treatment step in which heat treatment was performed at 300° C. for 30 minutes (thickness 50 μm).

(18) Production of Base Film A5

Except for performing the coating of the stainless steel plate to produce a final film with a thickness of 20 μm, the same film production procedure as for base film A4 was carried out to provide base film A5.

(19) Production of Base Film A6

A 1.5 L reaction vessel equipped with a stirrer, a nitrogen injection apparatus, a dropping funnel, a temperature controller, and a cooler was used and 769 g of N,N-dimethyl acetamide (DMAc) was supplied through nitrogen to fill the reaction vessel. Then, after adjusting the reaction vessel to a temperature of 25° C., 64.046 g of diamine 3 and 64.046 g of diamine 4 were dissolved to provide a first solution, followed by maintaining this first solution at 25° C. After adding 8.885 g of acid anhydride 3 to the first solution, stirring was continued for an appropriate period to cause dissolution and reaction to provide a second solution.

After adding 13 g of pyridine and 17 g of acetic acid anhydride to the above polyamic acid solution, stirring was performed at 25° C. for 30 minutes and additional stirring was continued at 70° C. for 1 hour, followed by cooling to room temperature. The solution was poured into 20 L of methanol to cause precipitation and the precipitated solid material was separated by filtration, crushed, and dried at 100° C. for 6 hours under reduced pressure to provide 108 g of solid powder of a polyimide copolymer.

The above 108 g of solid powder of a polyimide copolymer was dissolved in 722 g of N,N-dimethyl acetamide (DMAc) to provide a solution with a concentration of 13 wt %. The solution thus obtained was spread over a stainless steel plate and dried in hot air at 130° C. for 30 minutes and the resulting film was removed from the stainless steel plate and fixed to a frame with pins. The frame and the film fixed thereto were put in a vacuum oven, heated up gradually for 2 hours from 100° C. to 300° C., and then gradually cooled, followed by separating the polyimide film from the frame. Subsequently, the polyimide film was subjected to the final heat treatment step in which heat treatment was performed at 300° C. for 30 minutes (thickness 85 μm).

(20) Production of Base Film A7

In a 1,000 L reaction tank of glass lining equipped with a stirrer (having three sweptback wing type stirring blades), 43.90 kg of diamine 1 and 645.70 kg of N-methyl-2-pyrrolidone were fed and cooled to 0° C. in a nitrogen atmosphere, and a total of 31.74 kg of acid dichloride 4 was dropped continuously over 30 minutes while stirring. After stirring for 1 hour, the hydrogen chloride generated from the reaction was neutralized with lithium carbonate to provide a polymer solution with a polymer concentration of 9 mass %.

The resulting polymer solution was flow-cast through a nozzle onto an endless belt with a mirror surface to provide a final film having a thickness of 23 Then, the flow-cast polymer solution was heated in hot air at 130° C. for 6 minutes to evaporate the solvent and the resulting film was removed from the endless belt while stretching it to a ratio of 1.10 in the length direction. Then, it was introduced into a water tank in which pure water at 40° C. was flowing to perform demineralization and desolvation. Furthermore, the film coming out of the water tank was introduced into a tenter, stretched to a ratio of 1.30 at 280° C., relaxed to a ratio of 0.985 at 300° C., and heat-treated at the same temperature to provide base film A7.

Example 1

A protective film with a thickness of 100 μm (CT100, manufactured by Panac Co., Ltd.) was attached to one side of base film A1 and coating material B1 was spread over the protective film-free side using a bar coater (#6) (manufactured by Matsuo Sangyo Co., Ltd.), followed by drying at 100° C. for 2 minutes. Then, the coating film was hardened by exposure to ultraviolet ray at 320 mJ/cm$^2$ in a nitrogen atmosphere to provide a film having a lamination structure of B1 layer/A1 layer/protective film. Subsequently, a protective film (CT100, manufactured by Panac Co., Ltd.) was attached to the surface of the B1 layer to provide a film having a lamination structure of protective film/B1 layer/A1 layer/protective film. Then, the protective film on the A1 layer was removed and coating material B1 was spread on the A1 layer using a bar coater (#6) (manufactured by Matsuo Sangyo Co., Ltd.), dried at 100° C. for 2 minutes, and hardened by exposure to ultraviolet ray at 320 mJ/cm$^2$ in a nitrogen atmosphere to provide a film having a lamination structure of protective film/B1 layer/A1 layer/B1 layer. Finally, the protective film was removed to provide a laminated film. Various physical properties of the resulting laminated film were measured and results obtained are shown in Table 1.

Examples 2 to 15 and Comparative Examples 2 to 4

Except that the base film and the curing agent coating liquid used in Example 1 were replaced as shown in Table 1 or Table 2, the same procedure as in Example 1 was carried out to prepare a laminated film having a hardening layer. Various physical properties of the resulting laminated film were measured and results obtained are shown in Table 1 and Table 2.

Comparative Example 1

Characteristics of the base film alone are shown in Table 2.

TABLE 1

| | | | Example 1 | Example 2 | Example 3 | Example 4 | Example 5 | Example 6 | Example 7 | Example 8 | Example 9 | Example 10 |
|---|---|---|---|---|---|---|---|---|---|---|---|---|
| Base film | | No. | A1 | A1 | A1 | A1 | A1 | A1 | A1 | A1 | A1 | A2 |
| Hardening layer | No. | | B1 | B2 | B3 | B1 | B1 | B1 | B1 | B1 | B1 | B1 |
| | Particles | particle diameter, nm | 100 | 100 | 15 | 100 | 100 | 100 | 100 | 100 | 100 | 100 |
| | | surface treatment | treated | not treated | treated | treated | treated | treated | treated | treated | treated | treated |
| | | content, mass % | 50 | 50 | 50 | 25 | 75 | 50 | 50 | 50 | 50 | 50 |

TABLE 1-continued

|  |  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|---|
|  | Solvent | type | toluene/MEK | toluene/MEK | toluene/MEK | toluene/MEK | toluene/MEK | toluene/MEK | toluene/MEK | toluene/MEK | toluene/MEK | toluene/MEK |
|  |  | proportion, mass ratio | 70/30 | 70/30 | 70/30 | 70/30 | 70/30 | 70/30 | 70/30 | 85/15 | 50/50 | 70/30 |
| Layer constitute |  |  | B/A/B | B/A/B | B/A/B | B/A/B | B/A/B | B/A/B | B/A/B | B/A/B | B/A/B | B/A/B |
| Thickness | Total thickness | μm | 33 | 33 | 33 | 33 | 33 | 43 | 25 | 33 | 33 | 60 |
|  | Base material | μm | 23 | 23 | 23 | 23 | 23 | 23 | 23 | 23 | 23 | 40 |
|  | Hardening layer | μm | 5 | 5 | 5 | 5 | 5 | 10 | 1 | 5 | 5 | 10 |
|  | Interlayer | μm | 3.1 | 3.3 | 2.8 | 3.5 | 2.6 | 3.9 | 1.2 | 0.3 | 6.5 | 2.8 |
| Light Transmittance |  | % | 89 | 87 | 89 | 91 | 89 | 90 | 88 | 91 | 84 | 87 |
| Haze |  | % | 1.2 | 1.4 | 1.2 | 1.3 | 1.5 | 1.1 | 1.4 | 1.2 | 2.5 | 1.8 |
| YI |  | — | 2.5 | 2.6 | 2.2 | 2.2 | 2.9 | 2.4 | 2.5 | 2.5 | 2.7 | 2.8 |
| Glass transition temperature |  | °C. | 330 | 330 | 330 | 330 | 330 | 310 | 335 | 335 | 300 | 330 |
| Storage modulus |  | GPa | 9.2 | 8.8 | 9.1 | 9.2 | 9.4 | 8.1 | 9.5 | 9.2 | 7.9 | 8.7 |
| Young's modulus by nanoindenter |  | GPa | 8.5 | 7.1 | 7.3 | 5.6 | 8.1 | 8.7 | 8.4 | 8.6 | 8.0 | 8.4 |
| Rate of deformation |  | ppm | 10 | 10 | 10 | 20 | 10 | 150 | 10 | 10 | 150 | 20 |
| Surface roughness |  | nm | 5.2 | 6.5 | 3.3 | 3.1 | 7.9 | 5.3 | 5.0 | 5.2 | 5.5 | 5.2 |
| AFM elastic modulus | Base material | GPa | 9.5 | 9.5 | 9.5 | 9.5 | 9.5 | 9.5 | 9.5 | 9.5 | 9.5 | 9.5 |
|  | Hardening layer | GPa | 11.2 | 10.8 | 10.1 | 9.2 | 11.0 | 11.2 | 11.2 | 11.3 | 11.2 | 11.2 |
|  | Interlayer | GPa | 8.2 | 8.1 | 8.1 | 8.0 | 8.1 | 8.2 | 8.9 | 9.3 | 6.9 | 8.3 |
| Pencil hardness |  |  | 9H | 6H | 6H | 4H | 7H | 9H | 5H | 9H | 3H | 9H |
| Bending resistance |  |  | excellent | good | excellent | excellent | good | fair | excellent | fair | fair | fair |

TABLE 2

|  |  |  | Example 11 | Example 12 | Example 13 | Example 14 | Example 15 | Comparative example 1 | Comparative example 2 | Comparative example 3 | Comparative example 4 |
|---|---|---|---|---|---|---|---|---|---|---|---|
| Base film | No. |  | A3 | A4 | A5 | PET | A7 | A1 | A1 | A1 | A6 |
| Hardening layer | No. |  | B1 | B1 | B1 | B1 | B1 | — | B1 | B1 | B1 |
|  | Particles | particle diameter, nm | 100 | 100 | 100 | 100 | 100 | — | 100 | 100 | 100 |
|  |  | surface treatment | treated | treated | treated | treated | treated | — | treated | treated | treated |
|  |  | content, mass % | 50 | 50 | 50 | 50 | 50 | — | 15 | 50 | 50 |
|  | Solvent | type | toluene/MEK | toluene/MEK | toluene/MEK | toluene/MEK | toluene/MEK | — | toluene/MEK | MEK | toluene/MEK |
|  |  | proportion, mass ratio | 70/30 | 70/30 | 70/30 | 70/30 | 70/30 | — | 70/30 | 100 | 70/30 |
| Layer constitution |  |  | B/A/B | B/A/B | B/A/B | B/A/B | B/A/B | A | B/A/B | B/A/B | B/A/B |
| Thickness | Total thickness | μm | 22.5 | 60 | 40 | 70 | 33 | 23 | 33 | 33 | 105 |
|  | Base material | μm | 12.5 | 50 | 20 | 50 | 23 | 23 | 23 | 23 | 85 |
|  | Hardening layer | μm | 5 | 5 | 10 | 10 | 5 | — | 5 | 5 | 10 |
|  | Interlayer | μm | 3.5 | 3.1 | 2.6 | absent | 2.4 | — | 3.5 | 8.5 | 3.1 |
| Light transmittance |  | % | 91 | 91 | 92 | 92 | 89 | 87 | 90 | 81 | 92 |
| Haze |  | % | 1.0 | 0.9 | 0.8 | 0.7 | 0.7 | 1.5 | 1.3 | 4.5 | 0.7 |
| YI |  | — | 2.5 | 1.2 | 1.1 | 1.5 | 2.0 | 3.2 | 2.5 | 2.7 | 1.5 |
| Glass transition temperature |  | °C. | 310 | 310 | 310 | 70 | 330 | 315 | 300 | 280 | 300 |
| Storage modulus |  | GPa | 8.2 | 7.1 | 6.9 | 3.5 | 10.2 | 8.7 | 8.3 | 6.5 | 3.9 |
| Young's modulus by nanoindenter |  | GPa | 8.5 | 7.3 | 5.2 | 7.2 | 9.4 | 4.7 | 4.5 | 4.2 | 7.9 |
| Rate of deformation |  | ppm | 50 | 350 | 310 | 110 | 5 | 10 | 70 | 520 | 590 |
| Surface roughness |  | nm | 5.2 | 4.9 | 4.9 | 5.5 | 5.4 | 1.7 | 2.2 | 7.9 | 5.2 |
| AFM elastic modulus | Base material | GPa | 8.6 | 7.7 | 7.6 | 3.7 | 10.7 | 9.5 | 9.5 | 9.5 | 4.5 |
|  | Hardening layer | GPa | 11.2 | 11.1 | 11.0 | 11.0 | 11.2 | — | 8.4 | 10.6 | 11.1 |
|  | Interlayer | GPa | 7.4 | 9.2 | 9.8 | — | 8.6 | — | 8.1 | 6.1 | 6.2 |

TABLE 2-continued

|  | Example 11 | Example 12 | Example 13 | Example 14 | Example 15 | Comparative example 1 | Comparative example 2 | Comparative example 3 | Comparative example 4 |
|---|---|---|---|---|---|---|---|---|---|
| Pencil hardness | 5H | 7H | 2H | H | 9H | H | B | 6B | 2H |
| Bending resistance | excellent | fair | fair | fair | excellent | excellent | excellent | inferior | inferior |

The invention claimed is:

1. A laminated film comprising a base film, a hardening layer containing a hardening resin and particles on at least one side of the base film, and an interlayer disposed between the base film and each hardening layer
   wherein the laminated film has a total thickness of 1 to 100 μm,
   a light transmittance of 70% or more at a wavelength of 400 nm,
   a Young's modulus of 5 GPa or more when applying a nanoindenter to make a 1 μm depression into a surface of the hardening layer, and
   undergoes a rate of deformation of 500 ppm or less after applying a stress of 0.5 MPa for 30 minutes,
   wherein the hardening layer has a particles/resin ratio 20/80 to 80/20,
   wherein the interlayer has a thickness of 0.5 μm or more and 6 μm or less,
   wherein the interlayer is obtained by the use of a good solvent and a poor solvent in a mass ratio of 15/85 to 50/50 of good solvent to poor solvent when forming the hardening layer,
   wherein the good solvent is selected from the group consisting of acetone, methyl ethyl ketone, methyl isobutyl ketone, and n-methyl-2-pyrrolidone,
   wherein the poor solvent is selected from the group consisting of ethanol, methanol, isopropyl alcohol, butyl acetate, ethyl acetate, methyl acetate, toluene, and methylene chloride, and
   wherein the base film has a polymer structure including a resin containing fluorine, and the resin containing fluorine is at least one resin selected from the group consisting of polyamide, aromatic polyamide, polyimide, aromatic polyimide, polyamide-imide, and aromatic polyamide-imide.

2. The laminated film as set forth in claim 1, wherein
   the light transmittance of the laminated film is 70% to 100% at a wavelength of 400 nm,
   the Young's modulus of the laminated film is 5 to 20 GPa when applying a nanoindenter to make a 1 μm depression into the surface of the hardening layer, and
   the rate of deformation of the laminated film is 0 to 500 ppm after applying a stress of 0.5 MPa for 30 minutes.

3. The laminated film as set forth in claim 1, wherein the glass transition temperature of the laminated film is 150° C. or more.

4. The laminated film as set forth in claim 1, wherein the total thickness of the laminated film is 10 to 50 μm and the thickness of the hardening layer is 1 to 10 μm.

5. The laminated film as set forth in claim 1, wherein the hardening layer has a surface having an average roughness Ra of 1 to 10 nm.

6. The laminated film as set forth in claim 1, wherein the storage modulus of the laminated film as measured at 30° C. using a viscoelasticity measuring apparatus is 5 GPa or more.

7. The laminated film as set forth in claim 1, wherein the base film contains a structural unit as represented by any of chemical formulae (I) to (IV):

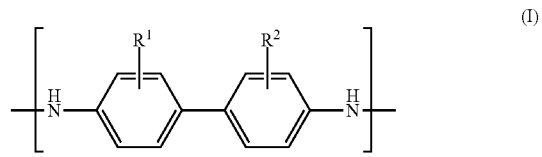
(I)

wherein $R^1$ and $R^2$ are each —H, an aliphatic group containing 1 to 5 carbon atoms, —$CF_3$, —$CCl_3$, —OH, —F, —Cl, —Br, —$OCH_3$, a silyl group, or a group containing an aromatic ring,

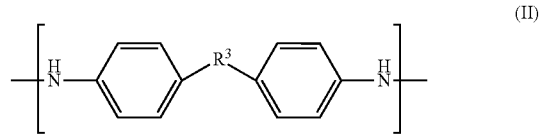
(II)

wherein $R^3$ is a group containing Si, a group containing P, a group containing S, a halogenated hydrocarbon group, a group containing an aromatic ring, or a group containing an ether bond,

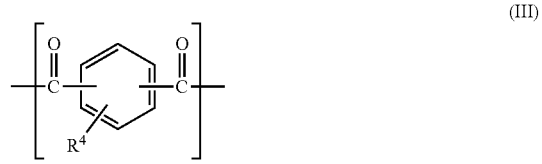
(III)

wherein $R^4$ may be any group, and

(IV)

wherein $R^5$ may be an aromatic group or an alicyclic group.

* * * * *